United States Patent [19]

Biter

[11] 4,042,418
[45] Aug. 16, 1977

[54] PHOTOVOLTAIC DEVICE AND METHOD OF MAKING SAME

[75] Inventor: William J. Biter, Murrysville, Pa.

[73] Assignee: Westinghouse Electric Corporation, Pittsburgh, Pa.

[21] Appl. No.: 710,971

[22] Filed: Aug. 2, 1976

[51] Int. Cl.² .................................... H01L 31/06
[52] U.S. Cl. ............................ 136/89 P; 29/572
[58] Field of Search ........... 136/89 P, 89 CD, 89 TF, 136/89 PC, 89 SJ; 29/572

[56] References Cited

U.S. PATENT DOCUMENTS

| 2,875,505 | 3/1959 | Pfann | 29/25.3 |
|---|---|---|---|
| 2,919,299 | 12/1959 | Paradise | 136/89 |
| 3,483,038 | 12/1969 | Hui et al. | 136/89 |
| 3,546,542 | 12/1970 | Riel et al. | 317/234 |
| 3,571,915 | 3/1971 | Shirland | 29/572 |
| 3,880,633 | 4/1975 | Jordan et al. | 65/60 |
| 3,902,920 | 9/1975 | Jordan et al. | 136/89 |
| 3,977,904 | 8/1976 | Kohler | 136/89 |

OTHER PUBLICATIONS

R. J. Mytton, "Integrated High Voltage Cadmium Sulphide Solar Batteries," Conf. Record, IEEE Photospecialists Conf., Aug. 1970, pp. 30-32.

Primary Examiner—John H. Mack
Assistant Examiner—Aaron Weisstuch
Attorney, Agent, or Firm—C. L. Menzemer

[57] ABSTRACT

An integrated array of solar cells is produced in continuous layers of photovoltaic junction forming semiconductor materials. Adjacent solar cells are sufficiently isolated by virtue of a relatively high resistivity in the semiconductor layers. The solar cells are connected in series by shorting the junction at selected points.

6 Claims, 3 Drawing Figures

PHOTOVOLTAIC DEVICE AND METHOD OF MAKING SAME

BACKGROUND OF THE INVENTION

1. Field of the Invention

The present invention pertains to photovoltaic devices and particularly to CdS-Cu$_2$S solar cells.

2. Description of the Prior Art

In order to provide a practical photovoltaic energy source, it is necessary to interconnect a large number of solar cells. There are many examples of arrangements of interconnected solar cells in the prior art.

One such prior art arrangement is described in U.S. Pat. No. 3,571,915, wherein a plurality of semiconductor films, each containing a photovoltaic junction, are arranged on an insulating substrate and serially conducted by means of electrodes between adjacent cells. A similar arrangement is described in U.S. Pat. No. 3,483,038.

Such prior art arrangements require complex means for interconnecting adjacent cells. The present invention eliminates much of the complexity involved with prior solar cell arrangements.

SUMMARY OF THE INVENTION

In accordance with the present invention, a photovoltaic device is produced by depositing a continuous layer of a first semiconductor material on a substrate, depositing a continuous layer of a second semiconductor material on the first continuous layer, a photovoltaic junction being formed between the layers, and interconnecting solar cell regions within the continuous layers by short circuiting the junction at selected points.

DESCRIPTION OF THE PREFERRED EMBODIMENTS

Figure 1:
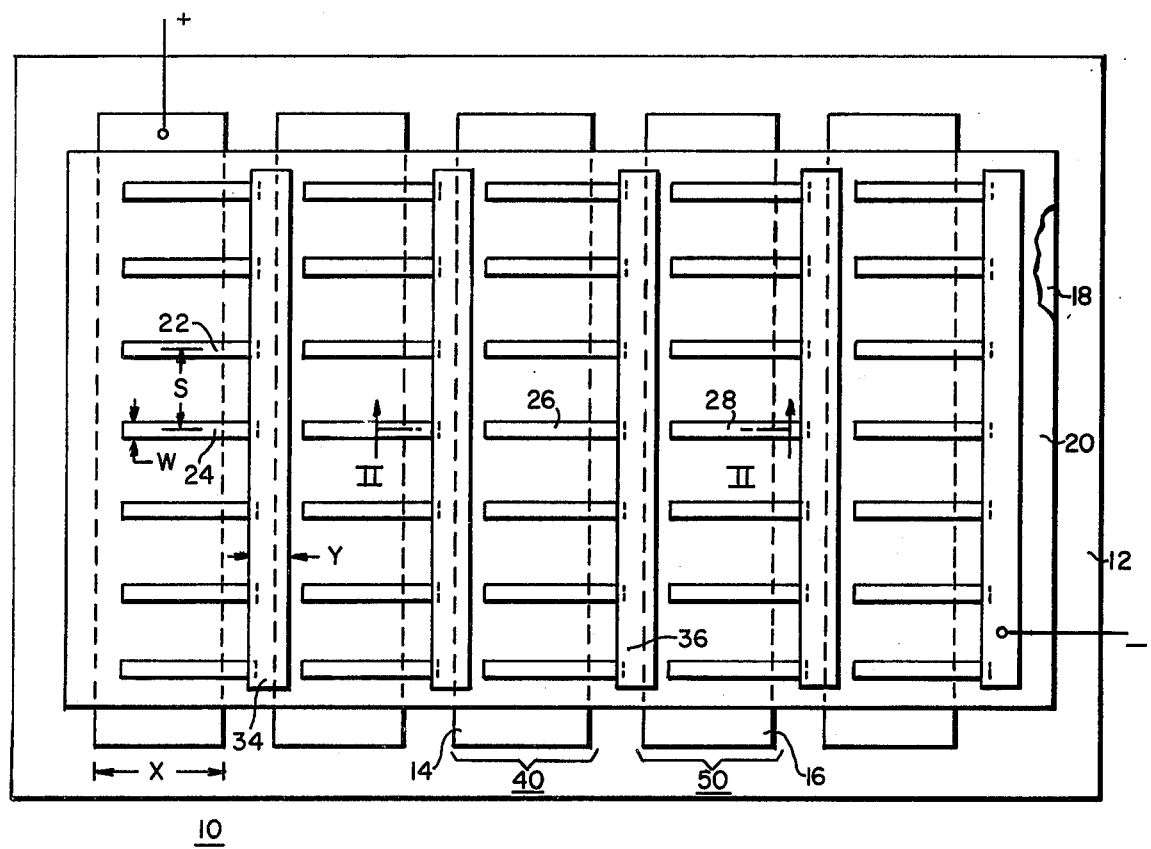
FIG. 1 is a plan view of a photovoltaic device produced in accordance with the present invention.

Referring to FIG. 1, there is shown a photovoltaic device 10 comprising a series array of solar cells. By way of example, a regular pattern of five solar cells is shown; however, any number of solar cells may be connected in series in accordance with the present invention.

Figure 2:
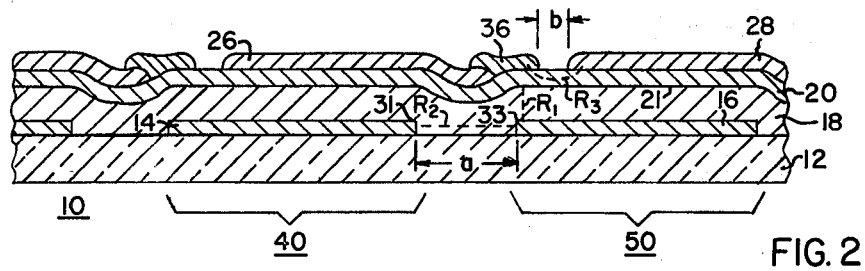
FIG. 2 is a vertical cross-section of a portion of the device of FIG. 1 enlarged to illustrate details; and, FIG. 3 is a vertical cross-section of an alternate embodiment of the present invention.

Continuing with the description of the present invention, a more detailed sectional view of a portion of device 10 is illustrated in FIG. 2. The device 10 comprises a substrate 12, which may be any one of known electrical insulating materials. Suitable materials are glass, anodized aluminum foil or a plastic foil such as the polyimide sold under the trademark KAPTON. A plurality of conductors are spaced apart on insulating substrate 12 as shown in FIGS. 1 and 2, only two of which are numbered for the sake of clarity. A first conductor 14 is disposed adjacent to a second conductor 16, the conductors being deposited on the substrate 12 in a known manner. Any conductive material which may be selectively deposited is suitable for the conductors 14 and 16. For example, aluminum, gold or tin oxide may be vapor deposited using aperture masks to achieve the desired pattern of conductors. Alternatively, suitable metals may be selectively plated on substrate 12 by means of mechanically masking portions of the substrate 12 from a plating solution. Likewise, the substrate 12 may be completely plated and then selectively etched.

After the conductors are in position on the substrate 12, a layer 18 of a first semiconductor material is deposited on the conductors and on the substrate between the conductors. A presently preferred material for semiconductor layer 18 is CdS, which may be vapor deposited in a known manner. A layer 20 of a second semiconductor material is disposed on layer 18, a photovoltaic junction 21 being formed therebetween. A presently preferred material for the semiconductor layer 20 is Cu$_2$S which is preferably vapor deposited on CdS layer 18 in a known manner. Alternatively, the Cu$_2$S layer 20 may be formed by dipping the device 10 into a solution containing cuprous ions. The cuprous ions displace cadmium ions to form the Cu$_2$S layer 20 on CdS layer 18. A plurality of like current carrying strips or grid members are disposed on Cu$_2$S layer 20 in a known manner using aperture masks to form a uniform grid pattern, which permits light to pass between strips thereby activating the solar cell. A suitable protective coating (not shown) is preferably deposited over the top of device 10, examples of suitable coatings being SiO$_2$, Si$_3$N$_4$ or a clear plastic. By way of example, FIG. 1 illustrates a grid pattern consisting of five rows of current carrying strips with seven strips per row. In actual practice the grid pattern may consist of hundreds of strips. Strips 22, 24, 26, and 28 are representative of the remaining strips, which, for the sake of clarity, are free of reference numerals. Current carrying strips 22 and 24 are used to illustrate the relative vertical spacing of the strips. A presently preferred grid spacing "s" is about 500 microns, while the presently preferred width "w" of current carrying strips is about 25 microns. Since the width "x" of adjacent conductors is typically on the order of 1 cm, it is necessary to greatly exaggerate the scale of the drawings to clearly show the details of the structure.

Each row of current carrying strips corresponds to an underlying conductor, the current carrying strips being slightly offset from the underlying conductor. As illustrated in more detail in FIG. 2, strip 26 overlies conductor 14 and extends beyond edge 31 of conductor 14 in the direction of conductor 16 to a point near adjacent facing edge 33 of conductor 16. Each row of current carrying strips are electrically connected in common. For example, a connecting strip 34 joins the row of current carrying strips in which strips 22 and 24 lie. Likewise, connecting strip 36 joins the row of current carrying strips in which strip 26 lies. The connecting strips have a presently preferred width "y" of about 40 microns, the strips preferably being vapor deposited through aperture masks using known registration techniques. The connecting strips lie directly over the facing edge of the adjacent conductor, as for example, connecting strip 36 lies directly over adjacent facing edge 33.

The connecting strips comprise a material which shorts the junction 21 in the immediate vicinity of the connecting strips. I have discovered that such desired shorting effect is produced by materials such as zinc, cadmium and indium, which presumably diffuse through Cu$_2$S layer 20 to the junction 21.

Again referring to the detailed view of FIG. 2, it remains to describe how a series connection of adjacent solar cells is achieved within device 10. A first solar cell 40 comprises conductor 14 and portions of the semiconductor layers 18 and 20 in juxtaposition over conductor 14. A second solar cell 50 comprises conductor 16 and portions of the semiconductor layers 18 and 20 in juxtaposition over conductor 16. The solar cells 40 and 50 are electrically connected in series by virtue of a low resistance path designated $R_1$ in FIG. 2. By the term low resistance path is meant that $R_1$ is selected to be on the order of 1 ohm for each square cm of cell area. The magnitude of $R_1$ depends on the resistivity and thickness of CdS layer 18, the preferred resistivity being between 1 and 100 ohm-cm, and the preferred thickness being about 30 microns.

To assure that adjacent solar cells 40 and 50 are not shorted, shunt resistance paths $R_2$ and $R_3$ must have a relatively high resistance in comparison to $R_1$. The magnitudes of $R_2$ and $R_3$ are determined by the resistivity of layers 18 and 20 and by the separation distances "$a$" and "$b$" respectively. It has been found that "$a$" $\leq$ 0.01 cm and "$b$" $\leq$ 0.25 cm produces a total shunt resistance ($R_2$ in parallel with $R_3$) which is much greater than $R_1$, about 200 times greater than $R_1$.

Therefore, it will be seen that a means for providing a low resistance path between current carrying strip 26 and conductor 16 comprises a connecting strip 36 of a material which penetrates through semiconductor layer 20 and shorts junction 21. It will be readily apparent that a series array of solar cells may be advantageously produced in the above described manner.

Figure 3:
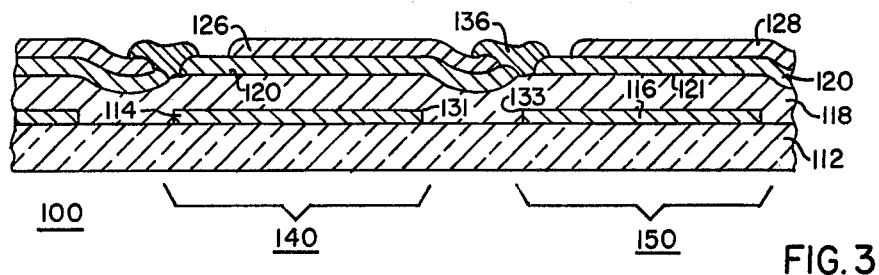

Now referring to FIG. 3, there is illustrated an alternative embodiment of the present invention, similar numerals designating similar parts. The device 100 of FIG. 3 is produced in a manner similar to that of device 10 of FIG. 2 with the exception that connecting strip 136 comprises a metal such as gold or silver which does not penetrate $Cu_2S$ layer 120. Therefore, prior to depositing the connecting strips, it is necessary to provide a window in $Cu_2S$ layer 120 along a line above edge 133 of conductor 116. The $Cu_2S$ can be removed by ordinary mechanical means such as abrading or scribing. Alternatively, windows in the $Cu_2S$ layer may be created by use of an electron beam or laser. Thus, in accordance with the embodiment of FIG. 3, means for providing a low resistance path between the current carrying strips 126 and the conductor 116 comprises a metallic strip 136 contacting a CdS layer 118 through a window in $Cu_2S$ layer 120.

It will be apparent to one skilled in the art that other structures performing similar functions may advantageously employ these teachings, which other structures are intended to be within the scope of the appended claims. For example, a so-called backwall solar cell arrangement may be similarly produced. In a backwall solar cell the light passes through a transparent substrate and translucent conductors (such as tin oxide) into the semiconductor material. In such an embodiment, a continuous metallic strip replaces the discontinuous grid arrangement of FIG. 1, there being no need for light passage ways between grid members.

What is claimed is:

1. A photovoltaic device comprising:
   a substrate;
   at least first and second conductors spaced apart on said substrate, said conductors having adjacent facing edges;
   a layer of a first semiconductor material overlying said conductors and said substrate between said adjacent facing edges;
   a layer of a second semiconductor material overlying said first semiconductor layer and forming a photovoltaic junction with said first semiconductor layer;
   current conducting means disposed on said second semiconductor layer over said first conductor, said current conducting means extending to a point in operative proximity to said adjacent facing edge of said second conductor; and
   means for providing a low resistance path between said current conducting means and said second conductor through said second semiconductor layer, said low resistance path means disposed above said adjacent facing edge of said second conductor; whereby said first conductor and portions of said semiconductor layers in juxtaposition over said first conductor define a first solar cell, said second conductor and portions of said semiconductor layers in juxtaposition over said second conductor define a second solar cell, and said solar cells are electrically connected in series by virtue of said low resistance path.

2. The photovoltaic device of claim 1 wherein said current conducting means comprises a plurality of metal grid members spaced apart in parallel, said grid members running perpendicular to said adjacent facing edges of said conductors; and, said low resistance path means comprises a metal connecting strip disposed directly over said adjacent facing edge of said second conductor, said metal connecting strip joining said grid members in common, said metal connecting strip being electrically connected to said first semiconductor layer.

3. The photovoltaic device of claim 2 wherein said first semiconductor layer comprises CdS and said second semiconductor layer comprises $Cu_2S$, and said metal connecting strip comprises a metal selected from the group consisting of zinc, cadmium and indium.

4. The photovoltaic device of claim 2 wherein said metal connecting strip is disposed on said first semiconductor layer through a window in said second semiconductor layer.

5. The photovoltaic device of claim 2 wherein said first semiconductor layer is about 30 microns thick, said first and second conductors are spaced greater than about 0.01 cm apart, and said metal connecting strip of said first solar cell is spaced greater than about 0.25 cm from grid members of said second solar cell.

6. A method of making a photovoltaic device comprising the steps: forming a plurality of conductors spaced apart on a substrate; depositing a layer of a first semiconductor material on said conductors and on said substrate between said conductors; depositing a layer of a second semiconductor material on said first semiconductor layer thereby forming a photovoltaic junction therebetween; depositing a plurality of current carrying strips on said second semiconductor layer overlying said conductors; and penetrating through portions of said second semiconductor layer to form a series array of solar cells.

* * * * *